Figure 5:
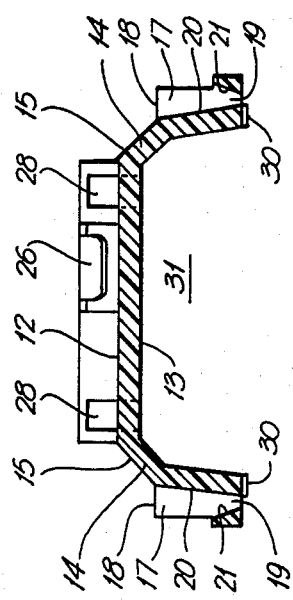

United States Patent [19]

Beun

[11] 4,417,095
[45] Nov. 22, 1983

[54] SUPPORT MEMBER FOR ELECTRONIC DEVICES

[75] Inventor: Roger A. Beun, Dunrobin, Canada

[73] Assignee: Northern Telecom Limited, Montreal, Canada

[21] Appl. No.: 314,099

[22] Filed: Oct. 23, 1981

[51] Int. Cl.³ .............................................. H05K 5/00
[52] U.S. Cl. ............................ 174/52 FP; 174/138 G; 339/17 CF; 361/403
[58] Field of Search ...................... 174/52 FP, 138 G; 339/17 C, 17 CF; 361/220, 400, 405, 412, 413, 403; 206/328, 334; 324/158 F

[56] References Cited

U.S. PATENT DOCUMENTS

| | | | |
|---|---|---|---|
| 3,345,541 | 10/1967 | Cobaugh et al. | 206/328 X |
| 3,825,876 | 7/1974 | Damon et al. | 206/328 X |
| 3,846,734 | 11/1974 | Pauza et al. | 174/52 FP X |
| 4,080,032 | 3/1978 | Cherian et al. | 339/17 CF X |
| 4,356,532 | 10/1982 | Donaher et al. | 174/52 FP X |

Primary Examiner—A. T. Grimley
Assistant Examiner—D. A. Tone
Attorney, Agent, or Firm—Sidney T. Jelly

[57] ABSTRACT

A support member for electronic devices, particularly for mounting devices on a printed circuit board, has a flat central web portion, side members extending down along each side of the central web portion, the side members connected to the web portion by inclined webs. Each side member has a plurality of slots extending down from its top edge, with an aperture at the bottom of each slot. A transverse rib extends upward at each end, with a resilient latch. The leads of an electronic device are guided by the upper surfaces of the inclined webs and the inner surfaces of the slots into the apertures and are correctly positioned for insertion in a printed circuit board. The device is held down by the latches. A protective cover can be positioned over the device, protrusions on the cover snapping into recesses in the transverse webs.

15 Claims, 11 Drawing Figures

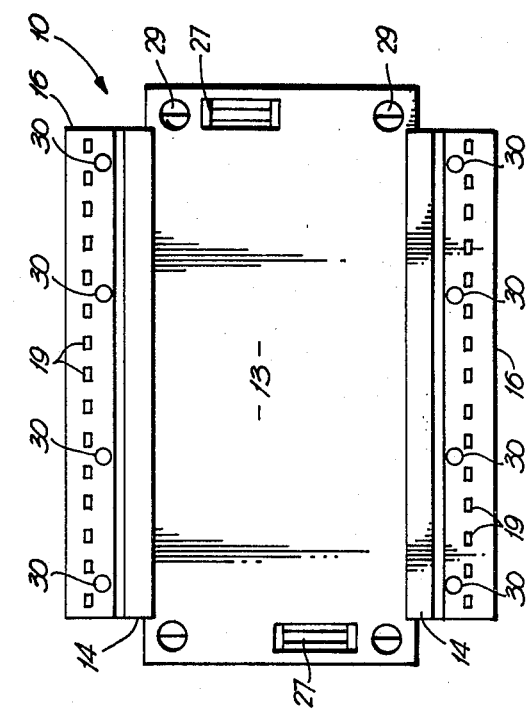
FIG. 3.
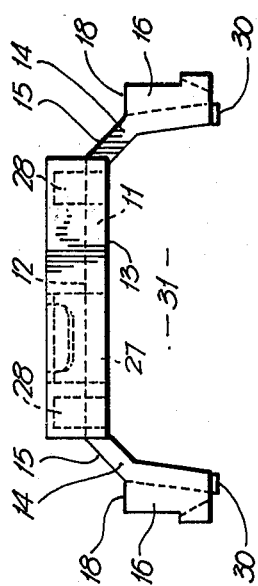
FIG. 4.
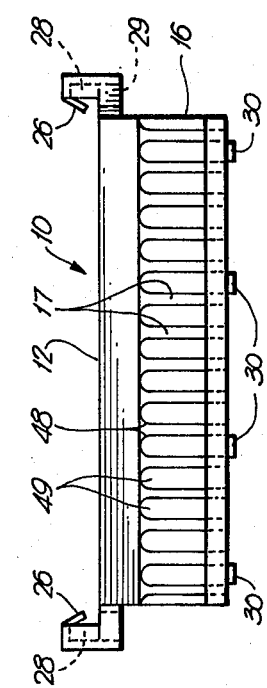
FIG. 1.
FIG. 2.

SUPPORT MEMBER FOR ELECTRONIC DEVICES

This invention relates to support members for electronic devices, and in particular to support members for hybrid circuit devices. The invention is also concerned with assemblies of devices and support members.

Electronic devices, for example hybrid devices and similar devices, are mounted on printed circuit boards (PCB's) by leads which extend down and enter into holes in the PCB. The leads generally extend through the PCB and are connected, as by flow soldering, to an electrical circuit on the back surface of the PCB, that is the surface remote from the device. However, devices can also be surface mounted, that is connected to a circuit on the front face of the PCB. Typically, the device is made on a ceramic or similar rigid substrate. The PCB has some flexibility and it has been found that flexing of the device can occur, causing damage to circuit parts on the device.

While it has been proposed to assemble the devices to support members prior to attachment to the PCB, assembling the devices to the support members is difficult, due to the long, relatively very fragile leads extending from the device. Obtaining alignment between all leads and all holes in a support member is time consuming.

The present invention provides a support member which facilitates rapid and easy assembly of a device to the support member. The device clips in place and a protector can be snapped in over the device. The assembly can then be mounted on a PCB, the support member also acting to align the device leads with holes in the PCB. As a further feature, the support member provides a space under the device which can be used for the mounting, and mounting, of components.

A support member, in accordance with the invention, comprises a flat central web portion and two side members extending one along each side of the central web portion, the side members joined to the web portion by inclined webs extending upward and inward from the top edges of the side members to the web portion. Each side member has a plurality of slots extending downward from the top edge, the slots connecting with apertures in the bottom of the side member. A transverse rib at each end of the central web portion, on the top surface thereof, has resilient latch for retention of a device. Undercuts may be provided for reception of projections on a cover member. The inner surface of each slot is inclined outward and downward and the apertures are tapered inward and downward, to assist in guiding leads of a device into the aperture.

Figure 8:
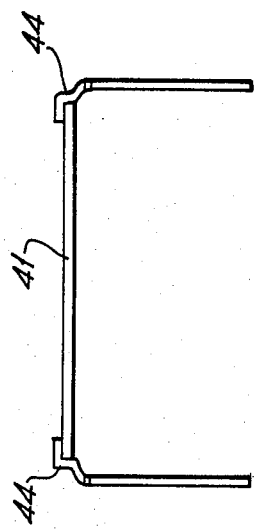
Figure 6:
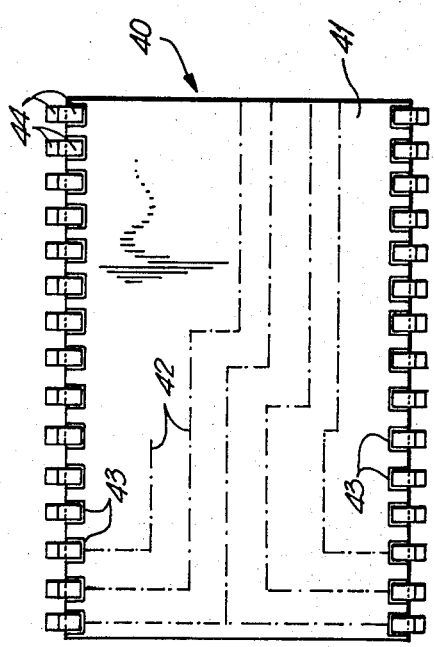
Figure 7:
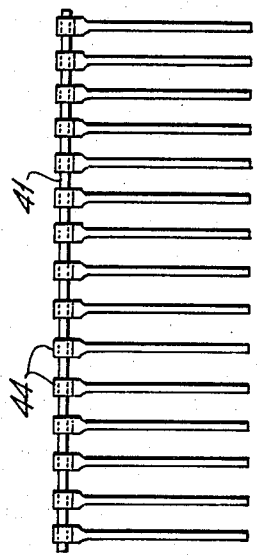
Figure 11:
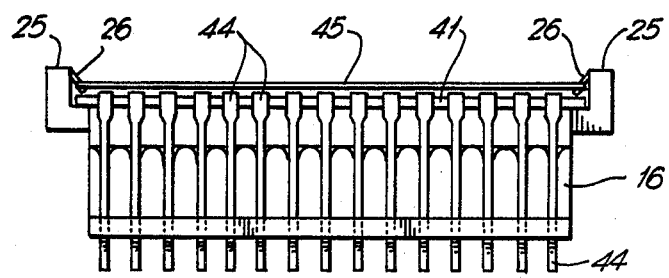
Figures 9, 10:
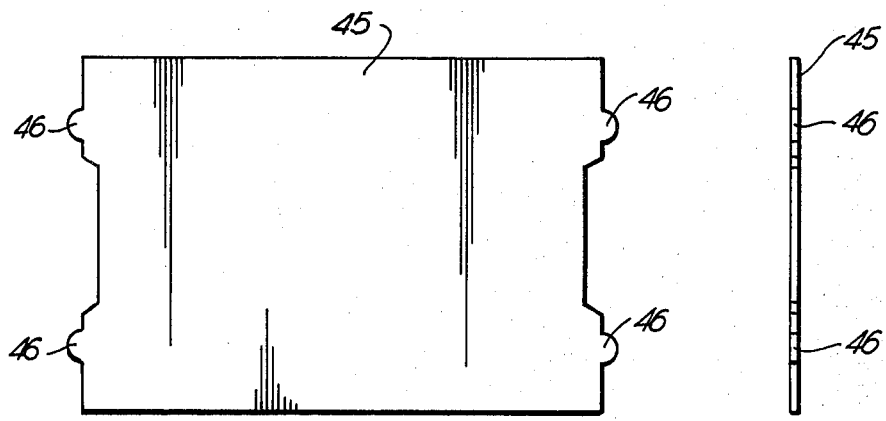

The invention will be readily understood by the following description of an embodiment, by way of example, in conjunction with the accompanying drawings, in which:

FIG. 1 is a top plan view of a support member;
FIG. 2 is a side view of the support member;
FIG. 3 is a bottom plan view of the support member;
FIG. 4 is an end view of the support member;
FIG. 5 is a cross-section on the line 5—5 of FIG. 1;
FIGS. 6, 7 and 8 are top plan view, side view and end view respectively of a device for mounting on the support member of FIGS. 1–5;
FIGS. 9 and 10 are plan view and end view of a cover member; and
FIG. 11 is a side view of an assembled device, support member and cover.

As illustrated in FIGS. 1 to 5, a support member 10 has a flat, rectangular central web portion 11, having a top surface 12 and a bottom surface 13. Depending from each side of the web portion 11 is a downwardly and outwardly inclined web 14, having an upper surface 15. At the lower edge of each web 14 is a side member 16, the side members extending along the side of the web portion 11.

The side members 16 each have a plurality of slots 17 extending down from the top edge 18 of the member. The slots extend down for a major part of a side member, connecting with apertures 19 at the lower part of a side member. In the example illustrated the apertures are rectangular, to suit rectangular section leads of a device. The inner surface 20 of each slot slopes downward and outward from its junction with the surface 15 of the related web 14. This slope, or inclination, extends into the apertures, and the outer surfaces 21 of the apertures 19 slope downward and inward.

At each end of the central web portion 11 is a transverse rib 25, extending upward from the top surface 12. Each rib 25 has a resilient latch 26 extending from the top, the latch comprising a flexible inwardly and downwardly extending projection. For convenience in molding, an aperture 27 is formed in the web portion 11 beneath each latch. In the example illustrated, the latches 26 are offset from each other, on either side of the central axis. Approximately at each end of each rib 25 there is an undercut or recess 28. This can be formed by forming a hole 29 up through the web portion 11 at each location during molding. Small bosses 30 on the bottom surfaces of the side members, space the bottom surfaces of the side members from the PCB, for wave soldering of leads. The side members create a space, indicated at 31, in which components can be positioned on the PCB.

The central web portion 11 provides a flat support and mounting surface. The transverse ribs 25 provide a high degree of lateral stiffness and the side members 14 provide a high degree of longitudinal stiffness. Thus the support member is quite rigid. At the same time, as the ribs 25 extend up from the central web portion and the side members are below the web portion, there is an "open" form of structure which assists in assembly of a device to a support member.

FIGS. 6, 7 and 8 illustrate one form of device 40 which can be mounted on a support member as in FIGS. 1 to 5. The device illustrated is a hybrid semiconductor device, having for example, a ceramic substrate 41 on a top surface of which are formed electrical and electronic circuit patterns 42, for example by thick films processes. Along each side of the substrate are contact pads 43 to which are soldered leads 44.

FIGS. 9–10 illustrate a cover 45, typically a thin sheet of clear flexible plastic material. At each end are two semi-circular protrusions 46.

FIG. 11 illustrates a support member, device and cover assembled. The device can be mounted on to the support member either by holding the device over the support member and moving the two together, all the leads entering the slots 17 and apertures 19 more or less simultaneously, or by holding the device at an angle to the web portion 11, the leads 44 along one side first inserted in slots 17 along one side of the support member. The device is then turned down to cause the leads 44 along the other side of the device to enter the slots 17 along the other side of the support member.

The leads are guided into the slots 17 by the sloping or inclined surfaces 15, and by the rounded tops 48 to the walls 49 between slots 17. The leads are further guided, first by surfaces 20 and then also by surfaces 21, to the apertures 19. The leads extend from the bottom of the side members 16 for insertion in, or attachment to, a PCB. The leads are guided on three sides initially and finally on all four sides. Thus it is very easy to assemble a device to a support member. Final pressure on a device deflects the latches 26 and the device snaps past the latches, being retained in place thereby.

A cover is applied by first inserting protrusions 46 at one end of the cover into the recesses 28 at one end of the support member. The other end of the cover is then pushed down, the protrusions at this other end snapping into the recesses 28 at the related end of the support member. The cover protects the top surface of the device and the circuit pattern thereon. Assembled devices and support members, with cover, can be stored in boxes without damage, or scratching of the circuit pattern. At a minumum the cover could have one protrusion 46 at each end, with one recess 28 in each transverse rib.

What is claimed is:

1. A support member for an electronic device, comprising:
   a flat central web portion;
   a side member extending along opposite sides of said central web portion:
   an inclined web connecting a top edge of each side member with the related side of said central web portion, each said inclined web extending upward and inward from the side member to said central web portion;
   a plurality of slots extending downward from the top edge of each side member;
   a plurality of apertures spaced along a bottom edge of each side member, an aperture aligned with each slot.

2. A support member as claimed in claim 1, each of said slots having an inner surface sloping downwards and outwards from said top edge of a side member.

3. A support member as claimed in claim 1, each aperture of rectangular cross-section, and including inner and outer surfaces, said inner and outer surfaces inclined downwards and inwards.

4. A support member as claimed in claim 1, including a transverse rib extending upward from said central web portion at end of said central web portion.

5. A support member as claimed in claim 4, including a resilient latch extending from a top edge of each transverse rib.

6. A support member as claimed in claim 5, each latch comprising a downwardly and inwardly extending flexible projection.

7. A support member as claimed in claim 4, including at least one recess in an inner surface of each transverse rib, said recess extending adjacent to a top surface of the transverse rib.

8. A support member as claimed in claim 7, including a recess adjacent to each end of each transverse rib.

9. A support member as claimed in claim 1, including a plurality of bosses on a bottom surface of each side member.

10. A support member as claimed in claim 1, for mounting an electronic device on a printed circuit board, said flat central web part, said side members and said inclined webs defining a space wherein components can be mounted on said printed circuit board.

11. A support member for supporting an electronic device on a printed circuit board, comprising:
    a rectangular central web portion having a top and a bottom surface, opposite sides and opposite ends;
    a downwardly and outwardly inclined web extending from each side of the central web portion and having an upper surface;
    a side member extending downwards from a lower edge of each downwardly and outwardly inclined web;
    a plurality of slots in each side member, extending down from a top edge of the side member, each slot having an inner surface sloping downwardly and outwardly from its junction with the upper surface of a downwardly and outwardly inclined web;
    a plurality of apertures in a lower part of each side member, an aperture connected to each slot, each aperture including an inner surface merging with said inner surface of the slot, and also including an outer surface sloping downward and inward;
    a transverse rib extending upward from said top surface of said central web portion at each end thereof; and
    a resilient latch extending from a top edge of each transverse rib, each said latch comprising a downwardly and inwardly extending flexible projection, for holding said device in position.

12. The combination of a support member and an electronic device mounted on said support member, said support member comprising a flat central web portion having top and bottom surfaces; a side member extending along opposite sides of said central web portion below said bottom surface, an inclined web connecting a top edge of each side member with the related side of said central web portion, each said inclined web extending upward and inward from the side member to said central web portion, a plurality of slots extending downward from the top edge of each side member and a plurality of apertures spaced along a bottom edge of each side member, an aperture aligned with each slot; and an electronic device positioned on said top surface of said flat central web portion, said device including a plurality of leads extending from each side, said leads extending down said slots and through said apertures.

13. A combination as claimed in claim 12, including a cover extending over said device.

14. A combination as claimed in claim 12, said device comprising a ceramic substrate, and including electrical and electronic circuit patterns on an upper surface thereon.

15. A combination as claimed in claim 12, including a transverse rib extending upward from said top surface of said central web portion at each end thereof and at least one recess in an inner surface of each transverse rib, and a cover extending over said central web portion and said device, said cover including at least one protrusion at each end, extending into said recesses.

* * * * *